(12) United States Patent
Park et al.

(10) Patent No.: US 10,790,473 B2
(45) Date of Patent: Sep. 29, 2020

(54) HIGH-APERTURE-RATIO MICRODISPLAY WITH MICROCAVITY STRUCTURE

(71) Applicant: LG DISPLAY CO., LTD., Seoul (KR)

(72) Inventors: Jiyeon Park, Paju-si (KR); Hansun Park, Paju-si (KR); Hyungseok Bang, Paju-si (KR); Hyeongjun Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/223,668

(22) Filed: Dec. 18, 2018

(65) Prior Publication Data

US 2019/0198816 A1    Jun. 27, 2019

(51) Int. Cl.
*H01L 51/52* (2006.01)
*G02B 27/01* (2006.01)
(Continued)

(52) U.S. Cl.
CPC .......... *H01L 51/5265* (2013.01); *G02B 5/284* (2013.01); *G02B 27/0172* (2013.01); *G02B 27/0176* (2013.01); *H01L 27/3246* (2013.01); *H01L 27/3248* (2013.01); *H01L 27/3258* (2013.01); *H01L 51/5209* (2013.01);
(Continued)

(58) Field of Classification Search
CPC ............. H01L 51/5265; H01L 27/3246; H01L 27/3248; H01L 27/3258; H01L 51/5209; H01L 51/5218; H01L 51/56; H01L 2251/558; G02B 5/284; G02B 27/0172; G02B 27/0176; G02B 5/201; G02B 27/017; G02B 2027/0118; G02B 2027/0147; G02B 2027/015; G02B 2027/0178

See application file for complete search history.

(56) References Cited

U.S. PATENT DOCUMENTS

2013/0105781 A1* 5/2013 Matsushima ....... H01L 51/5203
257/40
2017/0243928 A1 8/2017 Yang
(Continued)

FOREIGN PATENT DOCUMENTS

CN     1941384 A    4/2007
JP   2007059116 A   3/2007

OTHER PUBLICATIONS

Combined Search and Examination Report dated May 24, 2019, for corresponding GB Application No. GB 1821228.2.
(Continued)

*Primary Examiner* — Peter Bradford
(74) *Attorney, Agent, or Firm* — Polsinelli PC

(57) ABSTRACT

The disclosure relates to a high-aperture-ratio microdisplay with a microcavity structure. The microdisplay comprises a substrate, unit pixels, driving elements, and organic light-emitting diodes. The organic light-emitting diodes each comprise: an anode, an organic emission layer, and a cathode. The anode is formed by sequentially stacking a reflecting electrode, a first dielectric layer, a second dielectric layer, and a transparent electrode. The organic emission layer is stacked over the anode. The cathode is stacked over the organic emission layer. The first dielectric layer and the second dielectric layer have contact portion that open at least one corner of the reflecting electrode. The anode is connected to the reflecting electrode through the contact portions.

17 Claims, 13 Drawing Sheets

(51) Int. Cl.
      *H01L 27/32*       (2006.01)
      *H01L 51/56*       (2006.01)
      *G02B 5/28*        (2006.01)
      *G02B 5/20*        (2006.01)

(52) U.S. Cl.
     CPC .......... *H01L 51/5218* (2013.01); *H01L 51/56* (2013.01); *G02B 5/201* (2013.01); *G02B 27/017* (2013.01); *G02B 2027/015* (2013.01); *G02B 2027/0118* (2013.01); *G02B 2027/0147* (2013.01); *G02B 2027/0178* (2013.01); *H01L 2251/558* (2013.01)

(56) References Cited

U.S. PATENT DOCUMENTS

2019/0189706 A1*   6/2019   Choi ................... H01L 51/5253
2019/0326359 A1*  10/2019   Yang ....................... G06F 3/044

OTHER PUBLICATIONS

Office Action dated Nov. 5, 2019 issued in a corresponding Japanese Patent Application No. 2018-241923 (7 pages).
Japanese Office Action dated Apr. 22, 2020 issued in corresponding Patent Application No. 2018-241923 (8 pages).

* cited by examiner

HIGH-APERTURE-RATIO MICRODISPLAY WITH MICROCAVITY STRUCTURE

CROSS REFERENCE TO RELATED APPLICATION

This application claims the benefit of Korea Patent Application No. 10-2017-0181352 filed on Dec. 27, 2017, which is incorporated herein by reference in its entirety for all purposes as if fully set forth herein.

BACKGROUND

Field of the Disclosure

The present disclosure relates to a high-aperture-ratio microdisplay with a microcavity structure. More particularly, the disclosure relates to a high-aperture-ratio micro organic light-emitting diode display with a microcavity structure that provides high brightness in a personal immersive device for implementing virtual reality.

Description of the Background

Virtual reality refers to a particular environment and/or situation where users feel like they are really there by using a stereoscopic imaging technology. Virtual reality is being developed to provide auditory, tactile, and visual cues through all the human senses so that the users feel like they are in a real-world environment. Virtual reality devices, which integrate virtual reality technologies, are used in military, architecture, tourism, movies, multimedia, gaming, etc.

Augmented reality, which is a type of virtual reality, is a computer graphic technology that combines a real-world environment with virtual objects or information to make them look like real-world objects. For augmented reality, the user wears transparent glasses and sees virtual objects and videos together with a real-world environment through the glasses.

A personal immersive device is a device that uses virtual reality technology to enhance the sense of immersion for an individual user experiencing a virtual reality environment. Particularly, for this purpose, a display for maximizing a visual immersion feeling is considered to be the most important. Examples of a typical display used in the personal immersive device may include HMD (head mounted display), FMD (face mounted display), EGD (eye glasses-type display), etc. The display of the personal immersive device may be simply referred to as "personal immersive display".

It is desirable that the personal immersive display be small in size and lightweight because the user has to wear it like glasses. That is, it is important to develop a microdisplay which is very small in size and has high resolution and high aperture ratio in order to implement the personal immersive display.

SUMMARY

The disclosure has been made in an effort to overcome the aforementioned problems, and an aspect of the disclosure is to provide a personal immersive microdisplay that gives the highest possible sense of reality. Another aspect of the disclosure is to provide a personal immersive microdisplay that gives the highest possible sense of reality thanks to its high resolution and high brightness characteristics. Still another aspect of the disclosure is to provide a personal immersive microdisplay that ensures high resolution and high brightness characteristics by including a microcavity structure and maximizing light-emitting area.

An exemplary aspect of the disclosure provides a microdisplay comprising: a plurality of unit pixels arranged in a matrix on a substrate; driving elements placed in the unit pixels; and organic light-emitting diodes placed in the unit pixels and connected to the driving elements, respectively; wherein the organic light-emitting diodes each comprise: an anode in which a reflecting electrode, a first dielectric layer, a second dielectric layer, and a transparent electrode are sequentially stacked; a bank that covers edges of the anode, over the second dielectric layer; an organic emission layer stacked over the anode; and a cathode stacked over the organic emission layer, wherein the first dielectric layer and the second dielectric layer have contact portions that open at least one corner of the reflecting electrode, and the anode is connected to the reflecting electrode through the contact portions.

In this aspect, the microdisplay further comprises a bank that covers the edges of the anode, over the second dielectric layer, wherein each of the unit pixels comprises a first subpixel, a second subpixel, and a third subpixel, and wherein, in the first subpixel, the first dielectric layer and the second dielectric layer are stacked over the entire surface of the reflecting electrode, and the contact portion is placed under the bank.

In this aspect, in the second subpixel, the first dielectric layer is stacked over the entire surface of the reflecting electrode, the second dielectric layer is stacked only on the edges of the first dielectric layer, and the contact portion and the second dielectric layer are placed under the bank.

In this aspect, in the second subpixel, only the first dielectric layer is stacked over the entire surface of the reflecting electrode, and the contact portion is placed under the bank.

In this aspect, in the third subpixel, the first dielectric layer and the second dielectric layer are placed only under the bank, corresponding to the edges of the reflecting electrode, and an inside area of the reflecting electrode surrounded by the bank is directly surface-contacted with the transparent electrode.

In this aspect, in the third subpixel, the first dielectric layer and the second dielectric layer are not present, and the transparent electrode is stacked over the entire surface of the reflecting electrode.

In this aspect, the reflecting electrode and cathode of the first subpixel are spaced apart by a first distance corresponding to a sum of the thicknesses of the organic emission layer, first dielectric layer, and second dielectric layer, the reflecting electrode and cathode of the second subpixel are spaced apart by a second distance corresponding to a sum of the thicknesses of the organic emission layer and first dielectric layer, and the reflecting electrode and cathode of a third subpixel are spaced apart by a third distance corresponding to the thickness of the organic emission layer.

In this aspect, each of the unit pixels comprises a plurality of subpixels, and the microdisplay further comprises trenches that are formed in a continuous mesh pattern between the plurality of subpixels and separate the subpixels.

In this aspect, the microdisplay further comprises: a first planarization film covering the driving elements, over the substrate; and a second planarization film stacked over the first planarization film, wherein the trenches comprise: a first trench formed in the first planarization film; and a second trench in the second planarization film so that the second trench overlaps the first planarization film and is a smaller size than the first trench.

In this aspect, the reflecting electrode is formed by depositing a reflective electrode material over the entire surface where the first and second trenches are formed to divide the reflective electrode material into each section for each subpixel according to shapes of the first and second trenches.

In this aspect, the transparent electrode is formed by depositing a transparent electrode material over the entire surface where the first dielectric layer, second dielectric layer, and the first and second trenches are formed to divide the transparent electrode material into each section for each subpixel according to the shapes of the first and second trenches.

In this aspect, the microdisplay further comprises comprising pixel contact holes that are formed in the first planarization film and the second planarization film and have a forward tapered shape to expose portions of the driving elements, wherein the reflecting electrodes are contacted with the driving elements via the pixel contact holes.

The disclosure provides a method of manufacturing an organic light-emitting diode display comprising: forming driving elements on a substrate; applying a first planarization film over an entire surface of the substrate where the driving elements are formed; applying a second planarization film over the first planarization film; forming trenches with an inverse tapered shape to define subpixels on the first planarization film and the second planarization film; forming reflecting electrodes by depositing a metal material over the entire surface where the trenches are formed so that the reflecting electrodes have shapes of the subpixels by the trenches; forming a first dielectric layer and a second dielectric layer that are sequentially stacked in the inside areas of the surfaces of the reflecting electrodes and expose part of the corners of the reflecting electrodes; and forming transparent electrodes by depositing a transparent conductive material over an entire surface where the first dielectric layer and second dielectric layer are formed so that the transparent electrodes have shapes of the subpixels by the trenches.

The disclosure provides a personal immersive display with a microcavity structure. Particularly, the disclosure provides a personal immersive microdisplay that ensures high resolution and high brightness characteristics. A microdisplay according to the disclosure maximizes the amount of light in a particular wavelength range by applying a microcavity structure to each subpixel, thereby achieving high brightness. Moreover, the microdisplay according to the disclosure may maximize the light-emitting area because the reflective electrode and transparent electrode of the anode make contact with each other at the corners of the subpixel regions. In addition, a bank is formed to cover as little area as possible on the edge of the anode comprising the contact portions, thereby maximizing the light-emitting area. The microdisplay area may achieve high aperture ratio and high brightness characteristics at an ultra-high resolution.

BRIEF DESCRIPTION OF THE DRAWINGS

The accompanying drawings, which are included to provide a further understanding of the disclosure and are incorporated in and constitute a part of this disclosure, illustrate aspects of the disclosure and together with the description serve to explain the principles of the disclosure.

In the drawings.

DETAILED DESCRIPTION

Figure 1:
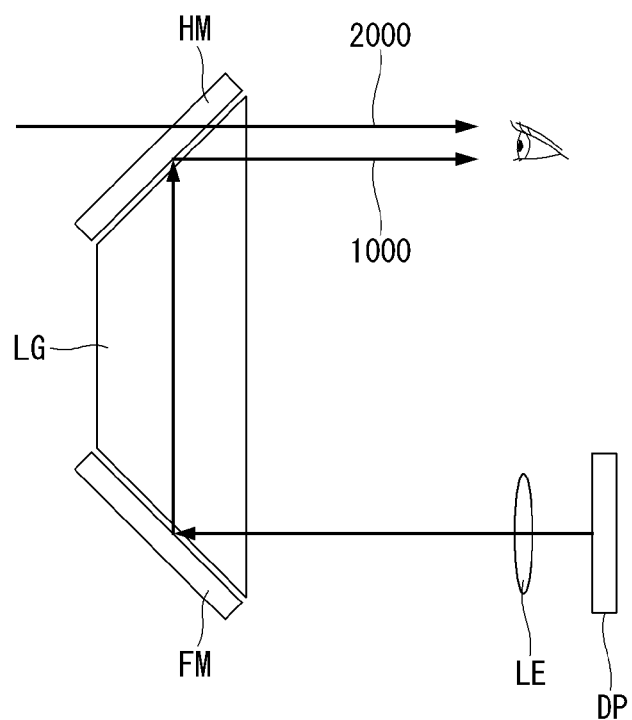
FIG. 1 is a schematic view of an augmented reality device comprising a microdisplay and an imaging lens according to the disclosure.

Various aspects and features of the disclosure and methods of accomplishing them may be understood more readily by reference to the following detailed descriptions of exemplary aspects and the accompanying drawings. The disclosure may, however, be embodied in many different forms and should not be construed as being limited to the exemplary aspects set forth herein. Rather, these exemplary aspects are provided so that this disclosure will be thorough and complete and will fully convey the concept of the disclosure to those skilled in the art, and the disclosure is defined by the appended claims.

The shapes, sizes, proportions, angles, numbers, etc. shown in the figures to describe the exemplary aspects of the disclosure are merely examples and not limited to those shown in the figures. Like reference numerals denote like elements throughout the specification.

In describing the disclosure, detailed descriptions of related well-known technologies will be omitted to avoid unnecessary obscuring the disclosure. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated. When the position relation between two parts is described using the terms "on", "over", "under", "next to" and the like, one or more parts may be positioned between the two parts as long as the term "immediately" or "directly" is not used.

It will be understood that, although the terms "first", "second", etc. may be used herein to describe various elements, these elements are not limited by these terms. These terms are used to distinguish one element from another element. The terms and names of elements used herein are chosen for ease of description and may be different from the names of parts used in actual products.

The features of various exemplary aspects of the disclosure may be coupled or combined with one another either partly or wholly, and may technically interact or work together in various ways. The exemplary aspects may be carried out independently or in connection with one another.

Hereinafter, various exemplary aspects of the disclosure will be described in detail with reference to the accompanying drawings. In the exemplary aspects below, the description of an electroluminescence display will focus on an organic light-emitting display comprising organic light-emitting material. However, it should be noted that the technical idea of the disclosure is not limited to organic light-emitting displays but also may apply to inorganic light-emitting displays comprising inorganic light-emitting material.

First of all, referring to FIG. 1, an example of a personal immersive device to which a microdisplay according to the disclosure is applied will be described. FIG. 1 is a schematic view illustrating a structure of an augmented reality device that comprises a microdisplay and an imaging lens according to the disclosure. The microdisplay according to the disclosure may be applied to a virtual reality device as well.

The augmented reality device according to the disclosure comprises a display panel DP, an imaging lens LE, a total reflecting mirror FM, a light guide LG, and a half-transparent mirror HM. Particularly, it is desirable that the display panel DP be a flat display panel such as an organic light-emitting diode display panel. The imaging lens LE is placed in front of the display panel DP. The center axis of the imaging lens LE coincides with the center axis of the display panel DP.

The total reflecting mirror FM is placed in front of the imaging lens LE. The total reflecting mirror FM reflects an entire video 1000 from the display panel DP that passes through the imaging lens LE and sends it into the light guide LG. The light guide LG delivers the video 1000 reflected by the total reflecting mirror FM to the half-transparent mirror HM without loss.

The half-transparent mirror HM reflects the video 1000 from the display panel DP delivered through the light guide LG and sends it to the user's eye. Also, the half-transparent mirror HM provides a real-world video 2000 entering from behind the half-transparent mirror HM, along with the video 1000, to the user's eye. Here, the real-world video 2000 is a video directly viewed by the user in a real-world environment. The video 1000 provided by the display panel DP and the real-world video 2000 can be viewed together. That is, useful information as a virtual video 1000 may be overlaid video onto the real-world video 2000 and provided as a single video.

The augmented reality device shown in FIG. 1 is made very small in size and, combined with glasses, can be worn by the user. In order to design the augmented reality device to be wearable on the user's body, the display panel DP may be made very small in size, for example, with a diagonal length of 1 inches or less.

In order to provide video information simultaneously with an external environment by using a flat display with a small display area, the video information requires high brightness. The augmented reality device should be available during both daytime and nighttime. That is, the augmented reality device is often used under the sun or in bright outdoor lighting. Thus, unless the augmented reality device has high brightness, virtual information and videos provided to the user may not be properly perceived.

<First Exemplary Aspect>

Figure 2:
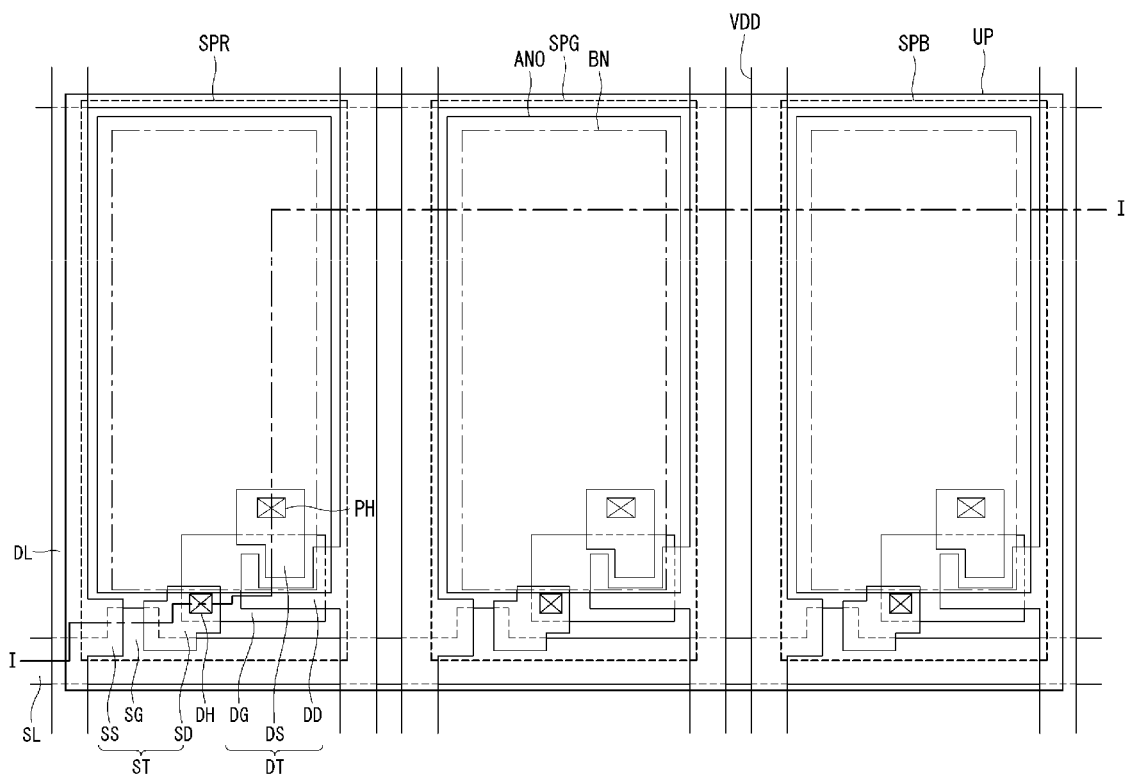
FIG. 2 is an enlarged plan view illustrating a structure of the microdisplay according to a first exemplary aspect of the disclosure.
Figure 3:
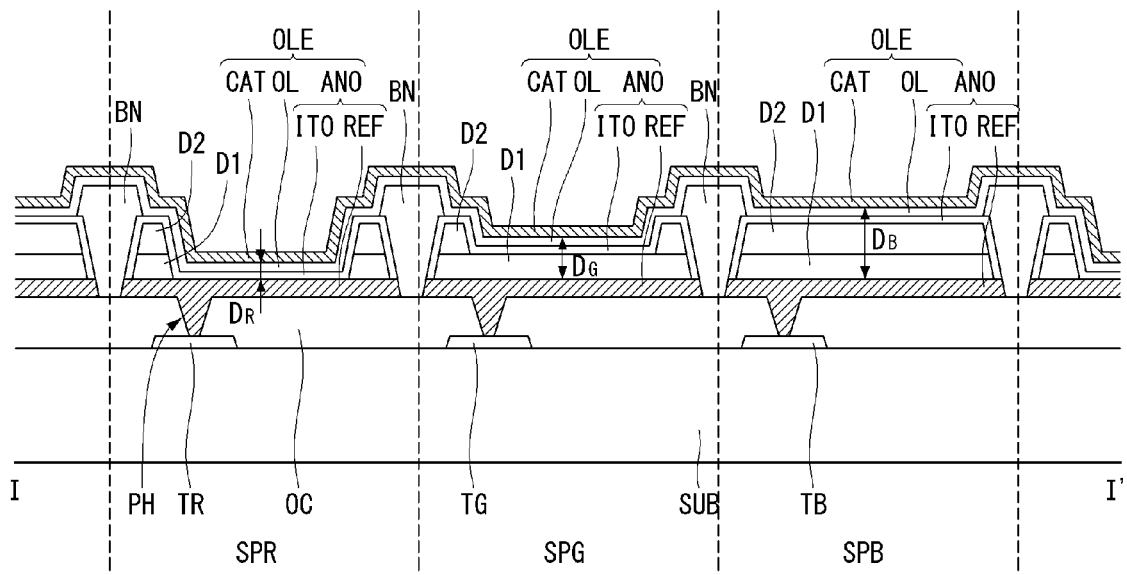
FIG. 3 is a cross-sectional view illustrating the structure of the microdisplay according to the first exemplary aspect of the disclosure, taken along line I-I' of FIG. 2.

Hereinafter, a microdisplay according to a first exemplary aspect of the disclosure will be described with reference to FIGS. 2 and 3. FIG. 2 is an enlarged plan view illustrating a structure of the microdisplay according to the first exemplary aspect of the disclosure. FIG. 3 is a cross-sectional view illustrating the structure of the microdisplay according to the first exemplary aspect of the disclosure, taken along line I-I' of FIG. 2.

Referring to FIG. 2, a micro organic light-emitting diode display applied to a personal immersive display has unit pixels UP arranged in a matrix on a substrate SUB. Each unit pixel UP comprises three subpixels SP—for example, a red subpixel SPR, a green subpixel SPG, and a blue subpixel SPB.

Each subpixel SP comprises a switching thin-film transistor ST, a driving thin-film transistor DT connected to the switching thin-film transistor ST, and an organic light-emitting diode OLE connected to the driving thin-film transistor DT. A scan line SL, a data line DL, and a drive current line VDD are arranged on the substrate SUB to define a pixel region. The organic light-emitting diode OLE is formed in the pixel region to define a light-emitting area.

The switching thin-film transistor ST is formed to be adjacent to intersection of the scan line SL and the data line DL. The switching thin-film transistor ST functions to select a pixel. The switching thin-film transistor ST comprises a gate electrode SG connected to the scan line SL, a semiconductor layer SA, a source electrode SS, and a drain electrode SD. The driving thin-film transistor DT serves to drive the organic light-emitting diode OLE of the pixel selected by the switching thin-film transistor ST.

The driving thin-film transistor DT comprises a gate electrode DG connected to the drain electrode SD of the switching thin-film transistor ST, a semiconductor layer DA, a source electrode DS connected to the drive current line VDD, and a drain electrode DD. The drain electrode DD of the driving thin-film transistor DT is connected to the anode ANO of the organic light-emitting diode OLE. An organic emission layer OL is interposed between the anode ANO and a cathode CAT. The cathode CAT is connected to a ground voltage.

Referring to FIG. 3, the micro organic light-emitting diode display applied to the personal immersive display will be described in further details. The switching thin-film transistor ST and the driving thin-film transistor DT are formed on a substrate SUB. FIG. 3, which is a cross-sectional view, shows only driving thin-film transistors TR, TG, and TB for convenience of explanation. For example, a red driving thin-film transistor TR is disposed in a red subpixel SPR, a green driving thin-film transistor TG is disposed in a green subpixel SPG, and a blue driving thin-film transistor TB is disposed in a blue subpixel SPB. A detailed cross-sectional structure of the thin-film transistors is not an important issue in the disclosure, so a detailed description thereof will be omitted. If necessary, the reference symbols of the thin-film transistors can be found in FIG. 3.

The surface of the substrate SUB where the thin-film transistors TR, TG, and TB are formed is not flat and has many stepped portions because of numerous elements formed on it. The organic emission layer OL needs to be formed on a flat surface to emit light uniformly and evenly. Thus, a planarization film OC (overcoat layer) is applied over an entire surface of the substrate SUB to flatten a surface over the substrate.

The anodes ANO of the organic light-emitting diodes OLE are placed on the planarization film OC. Here, the anodes ANO are connected to the drain electrodes DD of the driving thin-film transistors TR, TG, and TB via pixel contact holes PH formed in the planarization film OC.

Each anode ANO comprises a reflecting electrode REF disposed at a lower side and a transparent electrode ITO disposed at an upper side. Furthermore, the anode ANO comprise a first dielectric layer D1 and a second dielectric layer D2 that are stacked between the reflecting electrode REF and the transparent electrode ITO. The transparent electrode ITO is connected to the reflecting electrode REF through contact portions CNT formed at corners of the first and second dielectric layers D1 and D2 covering the reflecting electrode REF. The structures of the anodes ANO are slightly different for each of the subpixels SPR, RPG and SPB.

In the anode ANO of the blue subpixel SPB, the first dielectric layer D1 and the second dielectric layer D2 are both stacked between the transparent electrode ITO and the reflecting electrode REF.

In the anode ANO of the green subpixel SPG, the first dielectric layer D1 is stacked with uniform thickness between the transparent electrode ITO and the reflecting electrode REF. On the other hand, the second dielectric layer D2 may be stacked only on extremely narrow area of edges of the first dielectric layer D1. Although not shown, the first dielectric layer D1 is not present in the green subpixel SPG and only the second dielectric layer D2 may be interposed between the transparent electrode ITO and the reflecting electrode REF. That is, in the green subpixel SPG, only one of the first and the second dielectric layers D1 and D2 may be interposed between the transparent electrode ITO and the reflecting electrode REF.

In the anode ANO of the red subpixel SPR, most parts of the transparent electrode ITO and the reflecting electrode REF are directly contacted with each other. The first dielectric layer D1 and the second dielectric layer D2 are stacked only on extremely narrow area of edges of the reflecting electrode REF. Although not shown, the first dielectric layer D1 and the second dielectric layer D2 are not present in the red subpixel SPR and the transparent electrode ITO and the reflecting electrode REF are full-directly contacted with each other.

On the substrate SUB where the anodes ANO are formed, banks BN for defining light-emitting areas are formed on the regions where the switching thin-film transistors ST, driving thin-film transistors DT, and various wiring lines DL, SL, and VDD are formed. The portions of the anodes ANO exposed by the banks BN serve as the light-emitting areas. The organic emission layer OL is formed over the portions of the anodes ANO exposed by the banks BN. A layer of cathodes CAT is stacked over the organic emission layer OL.

The organic emission layer OL may be composed of an organic material that produces white light. The organic emission layer OL may be applied across the entire surface of the substrate since it does not emit light at a specific wavelength. In this case, although not shown, color filters may be stacked on the cathodes CAT to produce red, green, and blue light.

In the micro organic light-emitting diode display according to the disclosure, the distance between the reflecting electrode REF and the cathode CAT is different for each subpixel SP due to the structural differences between the anodes ANO. For example, the reflecting electrode REF and cathode CAT in the blue subpixel SPB are spaced apart by a first distance DB, with the transparent electrode ITO, first dielectric layer D1, second dielectric layer D2, and organic emission layer OL stacked between them. The reflecting electrode REF and cathode CAT in the green subpixel SPG are spaced apart by a second distance DG, with the transparent electrode ITO, first dielectric layer D1, and organic emission layer OL stacked between them. The reflecting electrode REF and cathode CAT in the red subpixel SPR are spaced apart by a third distance DR, with the transparent electrode ITO and organic emission layer OL stacked between them.

Light generated from the organic emission layer OL is reflected by the reflecting electrode REF and projected upward. In this case, the amount of light may be amplified or canceled out by a relationship between a spatial distance of light reflection and a wavelength of the reflected light. If the amount of light is canceled out, the light output is reduced, leading to a decrease in brightness. On the other hand, if the amount of light is amplified, the maximum light output is achieved, thus leading to high brightness. To amplify the amount of light, the spatial distance at which light generated from the organic emission layer OL is emitted and projected should be multiples of the wavelength of the reflected light. That is, it is possible to amplify a desired light by varying the distance between the reflecting electrode REF and the cathode CAT depending on the wavelength of the emitted light and achieve high brightness.

This phenomenon is called as a microcavity effect. As explained previously, a microcavity structure is formed due to the distance differences between the cathode CAT and the reflecting electrode REF in the red subpixel SPR, green subpixel SPG, and blue subpixel SPB. That is, the microcavity structure may be varied for each color subpixel, depending on the presence or absence of the first dielectric layer D1 and second dielectric layer D2. A detailed structure for forming a microcavity structure for each color subpixel will be described below. The following description is given of an exemplary aspect that takes into account the manufacturing process disclosed by the applicant, and may be different from the structure of FIG. 3. It is desirable to select an appropriate structure in accordance with the manufacturing environment and process conditions.

A detailed structure for forming a microcavity structure for each subpixel will be described below. The disclosure provides first and second exemplary aspects. However, the first and second exemplary aspects provide the same structure for each subpixel, except for the difference in the method of forming the anodes. Accordingly, the following description of a microcavity structure for each subpixel applies to both the first and second exemplary aspects.

Figure 4A:
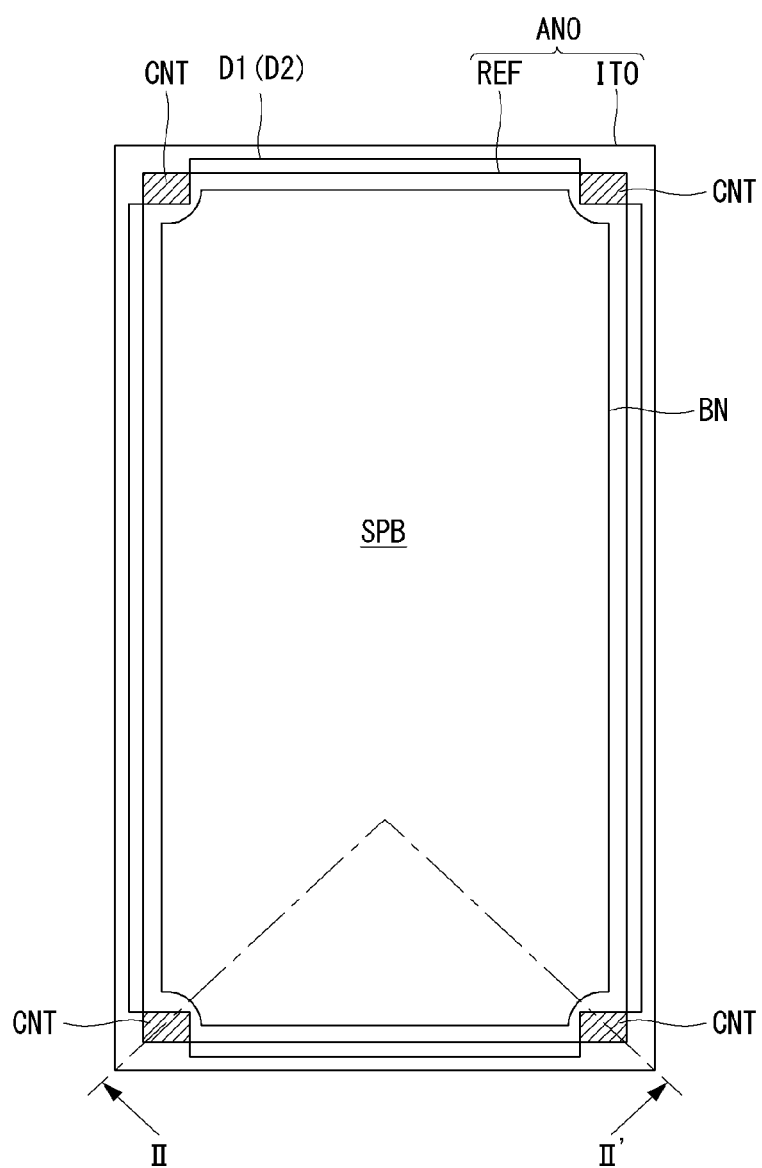
FIG. 4A is an enlarged plan view illustrating a first subpixel structure of a microdisplay according to the disclosure.
Figure 4B:
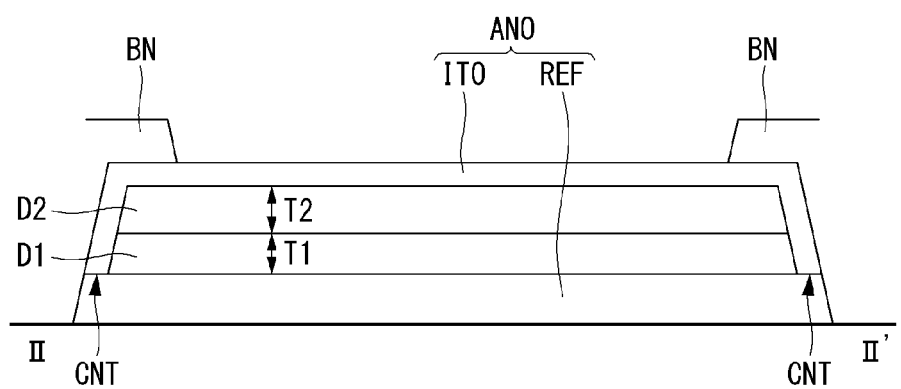
FIG. 4B is an enlarged cross-sectional view illustrating the first subpixel structure of the microdisplay according to the disclosure, taken along line II-II' of FIG. 4A.

First of all, a structure of the blue subpixel SPB, which is an example of a first subpixel, in the micro organic light-emitting diode display according to the disclosure will be described with reference to FIGS. 4A to 4B. FIG. 4A is an enlarged plan view of a first subpixel structure of a microdisplay according to the disclosure. FIG. 4B is an enlarged cross-sectional view of the first subpixel structure of the microdisplay according to the disclosure, taken along line II-II' of FIG. 4A.

The anode ANO of the blue subpixel SPB in the microdisplay of this disclosure comprises a reflecting electrode REF, a first dielectric layer D1, a second dielectric layer D2, and a transparent electrode ITO. The reflecting electrode REF may be made of a metal material with high light reflectance, such as silver (Ag), aluminum (Al), molybdenum (Mo), and/or titanium (Ti). The first electric layer D1 and the second dielectric layer D2 may be made of an organic material or inorganic material. The first electric layer D1 and the second dielectric layer D2 may be made of different materials or the same material. The transparent electrode ITO may be made of a transparent conductive material such as indium tin oxide or indium zinc oxide.

The reflecting electrode REF is formed first of all. For example, the reflecting electrode REF may have a rectangular shape. However, the reflecting electrode REF is not limited to this shape and may have other shapes like octagonal or elliptical. The first dielectric layer D1 and the second dielectric layer D2 are sequentially stacked on the reflecting electrode REF Contact portions CNT opening the four corners of the reflecting electrode REF are formed in the first dielectric layer D1 and second dielectric layer D2.

The transparent electrode ITO is stacked over the second dielectric layer D2. The transparent electrode ITO is in physical and electrical contact with and connected to the reflecting electrode REF through the contact portions CNT. In the anode ANO of the first subpixel, the reflecting electrode REF and the transparent electrode ITO are spaced apart by the sum T1+T2 of the thicknesses of the first dielectric layer D1 and second dielectric layer D2.

A bank BN is formed on the transparent electrode ITO. The bank BN has an opening that opens most of the central area of the transparent electrode ITO. For example, the bank BN may be shaped to cover all of the four sides and four corners of the transparent electrode ITO. The aperture ratio and brightness of the pixel are determined by the opening area of the bank BN. The larger the opening area, i.e., the higher the aperture ratio, the higher the brightness. Thus, it is desirable that the bank BN be configured to cover as little of the anode ANO as possible. For example, the bank BN may comprise the contact portions CNT, and may be shaped to cover as little surface area as possible on the edge of the anode ANO.

FIG. 4A illustrates that the elements are spaced a considerable distance apart from one another. However, this is for a better understanding of the drawing, and the boundaries of the elements may overlap in reality. If required, the elements may be spaced farther apart.

Figure 5A:
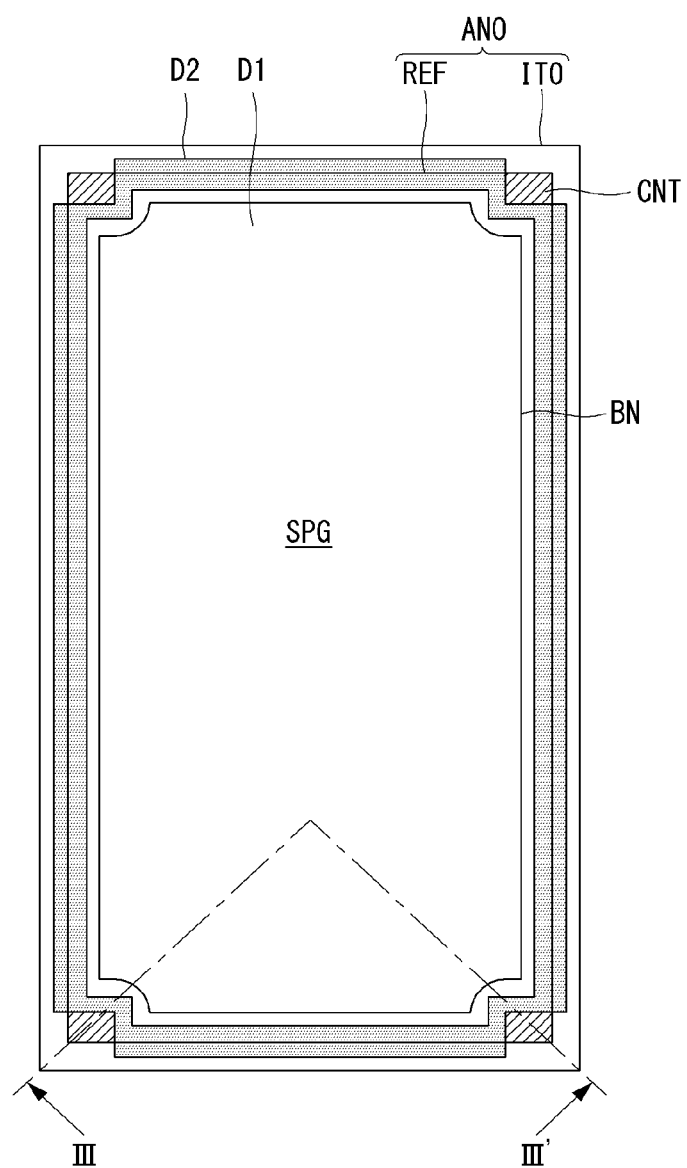
FIG. 5A is an enlarged plan view illustrating a second subpixel structure of a microdisplay according to the disclosure.
Figure 5B:
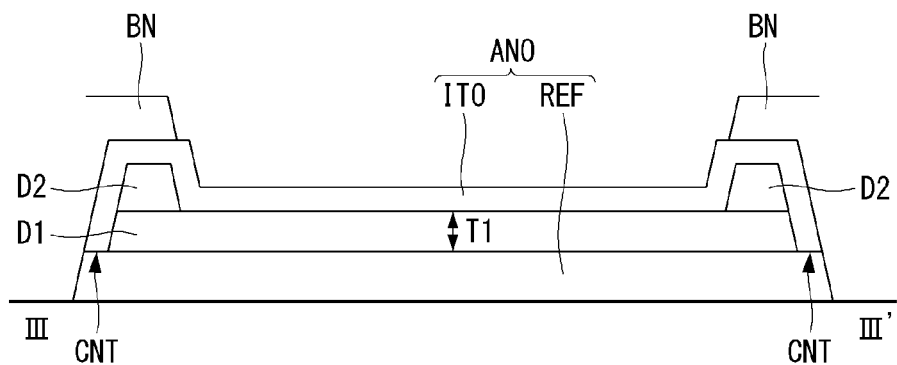
FIG. 5B is an enlarged cross-sectional view illustrating the second subpixel structure of the microdisplay according to the disclosure, taken along line III-III' of FIG. 5A.

Next, a structure of the green subpixel SPG, which is an example of a second subpixel, in the micro organic light-emitting diode display according to the disclosure will be described with reference to FIGS. 5A to 5B. FIG. 5A is an enlarged plan view illustrating a second subpixel structure of a microdisplay according to the disclosure. FIG. 5B is an enlarged cross-sectional view illustrating the second subpixel structure of the microdisplay according to the disclosure, taken along line III-III' of FIG. 5A.

The anode ANO of the green subpixel SPG in the microdisplay of this disclosure comprises a reflecting electrode REF, a first dielectric layer D1, a second dielectric layer D2, and a transparent electrode ITO. The reflecting electrode REF may be made of a metal material with high light reflectance, such as silver (Ag), aluminum (Al), molybdenum (Mo), and/or titanium (Ti). The first electric layer D1 and the second dielectric layer D2 may be made of an organic material or inorganic material. The transparent electrode ITO may be made of a transparent conductive material such as indium tin oxide or indium zinc oxide.

The reflecting electrode REF is formed first of all. For example, the reflecting electrode REF may have a rectangular shape. The first dielectric layer D1 and the second dielectric layer D2 are sequentially stacked on the reflecting electrode REF. Particularly, the second dielectric layer D2 is selectively stacked to cover as little surface area as possible on the edge of the first dielectric layer D1. Contact portions CNT opening the four corners of the reflecting electrode REF are formed in the first dielectric layer D1 and second dielectric layer D2. Although not shown, the second dielectric layer D2 may not be formed at all. In this case, the contact portions CNT are formed at the four corners of the first dielectric layer D1.

The transparent electrode ITO is stacked over the first dielectric layer D1 and second dielectric layer D2. The transparent electrode ITO is in physical and electrical contact with and connected to the reflecting electrode REF through the contact portions CNT. In the anode ANO of the second subpixel, the reflecting electrode REF and the transparent electrode ITO are spaced apart by the thickness Ti of the first dielectric layer D1.

A bank BN is formed on the transparent electrode ITO. The bank BN has an opening that opens most of the central area of the transparent electrode ITO. For example, the bank BN may be shaped to cover all of the four sides and four corners of the transparent electrode ITO. The aperture ratio and brightness of the pixel are determined by the opening area of the bank BN. The larger the opening area, i.e., the higher the aperture ratio, the higher the brightness. Thus, it is desirable that the bank BN be configured to cover as little of the anode ANO as possible. For example, it is desirable that the bank BN is shaped to cover as little surface area as possible on the edge of the anode ANO comprising the contact portions CNT and the second dielectric layer D2. That is, only the first dielectric layer D1 is interposed between the reflecting electrode REF and the transparent electrode ITO in the portion exposed by the bank BN.

Figure 6A:
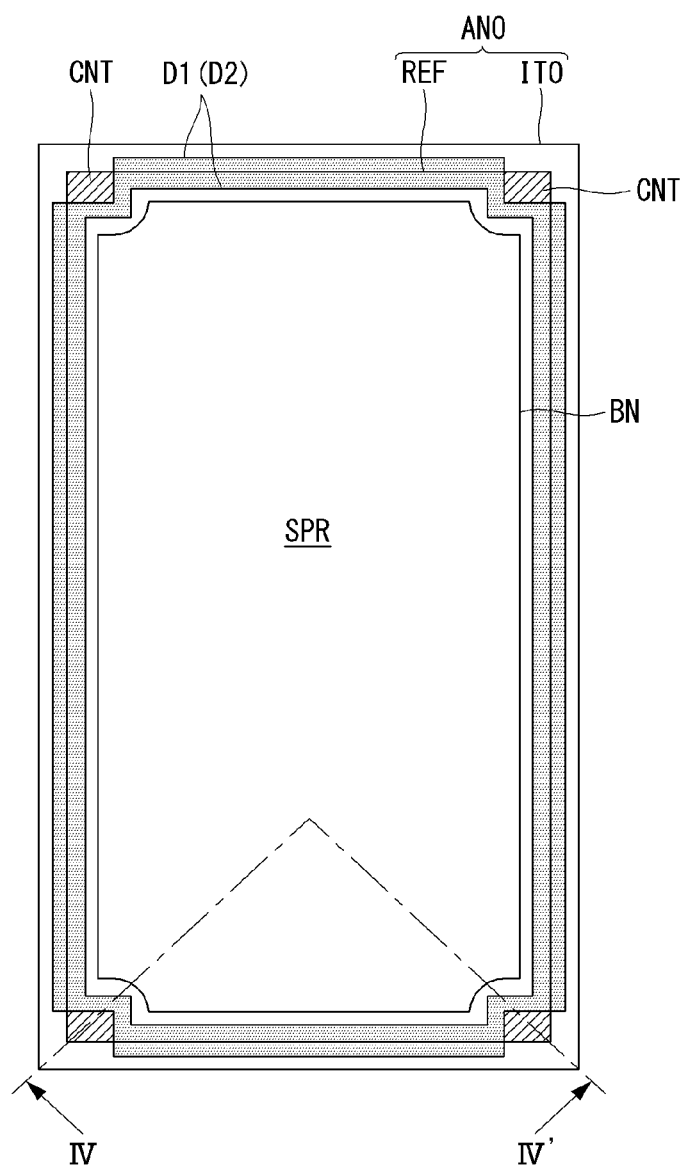
FIG. 6A is an enlarged plan view illustrating a third subpixel structure of a microdisplay according to the disclosure.
Figure 6B:
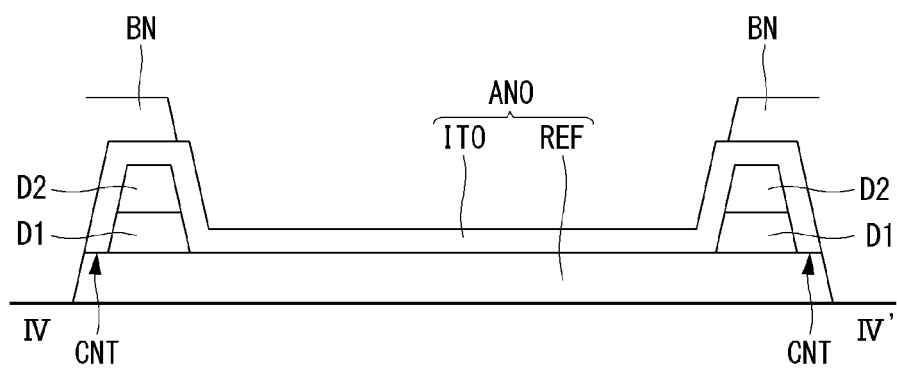
FIG. 6B is an enlarged cross-sectional view illustrating the third subpixel structure of the microdisplay according to the disclosure, taken along line IV-IV' of FIG. 6A.

Lastly, a structure of the red subpixel SPR, which is an example of a red subpixel, in the micro organic light-emitting diode display according to the disclosure will be described with reference to FIGS. 6A to 6B. FIG. 6A is an enlarged plan view illustrating a third subpixel structure of a microdisplay according to the disclosure. FIG. 6B is an enlarged cross-sectional view illustrating the third subpixel structure of the microdisplay according to the disclosure, taken along line IV-IV' of FIG. 6A.

The anode ANO of the red subpixel SPR in the microdisplay of this disclosure comprises a reflecting electrode REF, a first dielectric layer D1, a second dielectric layer D2, and a transparent electrode ITO. The reflecting electrode REF may be made of a metal material with high light reflectance, such as silver (Ag), aluminum (Al), molybdenum (Mo), and/or titanium (Ti). The first electric layer D1 and the second dielectric layer D2 may be made of an organic material or inorganic material. The transparent electrode ITO may be made of a transparent conductive material such as indium tin oxide or indium zinc oxide.

The reflecting electrode REF is formed first of all. For example, the reflecting electrode REF may have a rectangular shape. The first dielectric layer D1 and the second dielectric layer D2 are sequentially stacked on the reflecting electrode REF. Particularly, the first dielectric layer D1 and the second dielectric layer D2 are selectively stacked to cover as little surface area as possible on the edge of the reflecting electrode REF. Contact portions CNT opening the four corners of the reflecting electrode REF are formed in the first dielectric layer D1 and second dielectric layer D2.

Although not shown, the first dielectric layer D1 and the second dielectric layer D2 may not be formed at all. In this case, the contact portions CNT are not present at all, and the transparent electrode ITO is directly surface-contacted with the reflecting electrode REF.

The transparent electrode ITO is stacked over the first dielectric layer D1 and second dielectric layer D2. The transparent electrode ITO is in physical and electrical contact with and connected to the reflecting electrode REF through the contact portions CNT. Also, the transparent electrode ITO is physically and electrically connected to the reflecting electrode REF by making direct surface contact with most of the central area of the reflecting electrode REF. In the anode ANO of the third subpixel, the reflecting electrode REF and the transparent electrode ITO are not spaced apart from each other.

A bank BN is formed on the transparent electrode ITO. The bank BN has an opening that opens most of the central area of the transparent electrode ITO. For example, the bank BN may be shaped to cover all of the four sides and four corners of the transparent electrode ITO. The aperture ratio and brightness of the pixel are determined by the opening area of the bank BN. The larger the opening area, i.e., the higher the aperture ratio, the higher the brightness. Thus, it is desirable that the bank BN be configured to cover as little of the anode ANO as possible. For example, it is desirable that the bank BN is shaped to cover as little surface area as possible on the edge of the anode ANO comprising the contact portions CNT, the first dielectric layer D1, and the second dielectric layer D2. That is, the reflecting electrode REF and the transparent electrode ITO are directly surface-contacted with each other, in the open inside area of the reflecting electrode REF, surrounded by the bank BN.

The personal immersive display may be a small display with a diagonal length of 5 inches or less. Particularly, a microdisplay with a diagonal length of 1 inches or less is used as an augmented reality device. It is desirable that the personal immersive device provides high resolution, high brightness, and high aperture ratio because it has to give a sense of reality. In order to achieve an ultra-high resolution of 500 PPI or higher, the microdisplay requires a smaller pixel size. For example, in the case of a microdisplay with a resolution of 500 PPI, at least one side of a unit pixel has a length of 50 μm. In the case of a microdisplay with a resolution of 5,000 PPI, at least one side of a unit pixel has a length of 5 μm.

In such a micro organic light-emitting diode display with a micro pixel size, it is important to maximize the light-emitting area to ensure high brightness and high aperture ratio. The micro organic light-emitting diode display according to the disclosure maximizes the amount of light in a particular wavelength range by applying a microcavity structure to each subpixel, thereby achieving high brightness.

Moreover, the light-emitting area of the anode in the subpixel region may be maximized because the reflecting electrode and transparent electrode of the anode are contacted with each other at the corners of the reflecting electrode. In addition, a bank for defining a light-emitting area is formed to cover as little area as possible on the edge of the anode comprising the contact portions, thereby maximizing the light-emitting area.

<Second Exemplary Aspect>

Figure 7:
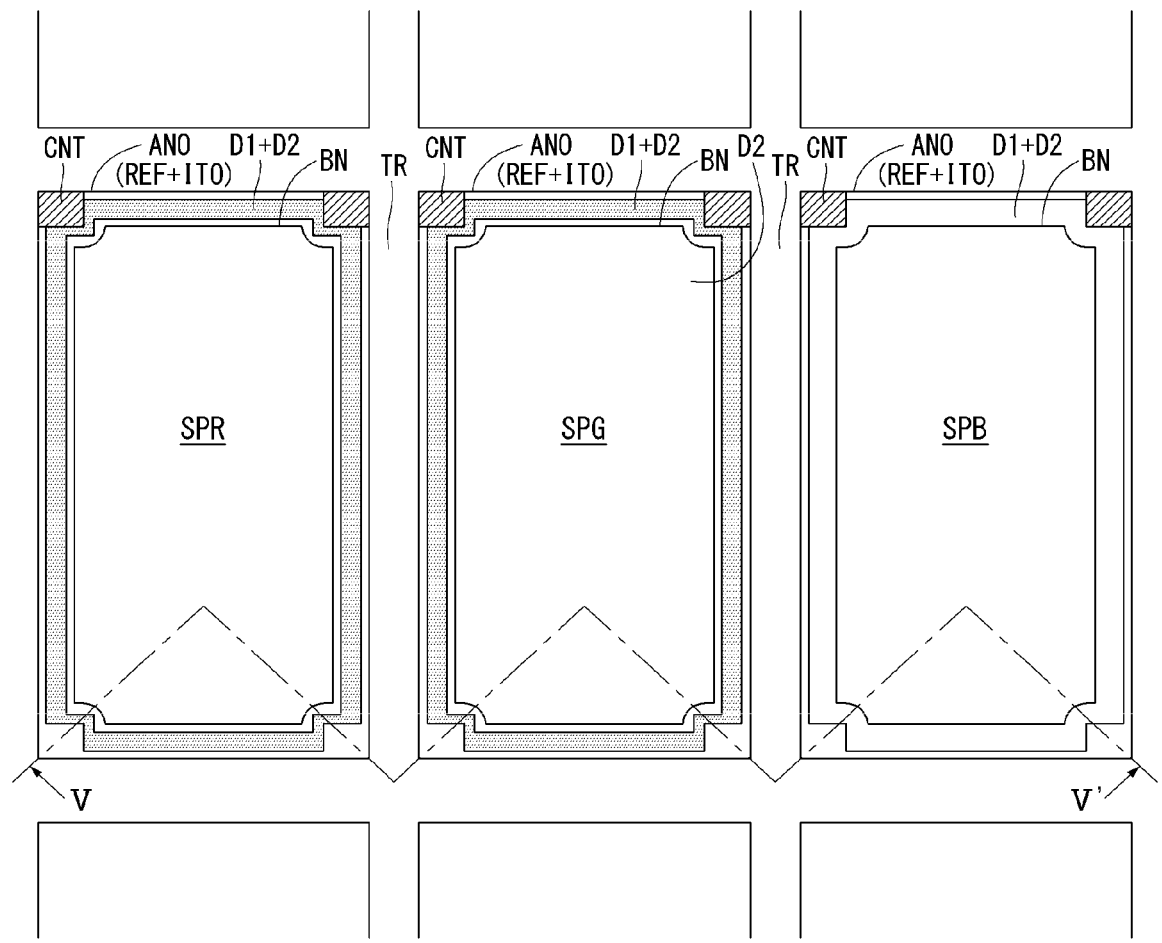
FIG. 7 is an enlarged plan view of a structure illustrating the microdisplay according to a second exemplary aspect of the disclosure.

Hereinafter, a second exemplary aspect will be described with respect to a manufacturing process for achieving the highest aperture ratio in a microdisplay with a microcavity structure and a very small pixel size and a structure formed by the manufacturing process. FIG. 7 is an enlarged plan view illustrating a structure of the microdisplay according to a second exemplary aspect of the disclosure.

First of all, referring to FIG. 7, a micro organic light-emitting diode display applied to a personal immersive display according to the second exemplary aspect of the disclosure has unit pixels UP arranged in a matrix on a substrate SUB. Each unit pixel UP comprises three subpixels SP—for example, a red subpixel SPR, a green subpixel SPG, and a blue subpixel SPB.

Each subpixel SP comprises a switching thin-film transistor ST, a driving thin-film transistor DT connected to the switching thin-film transistor ST, and an organic light-emitting diode OLE connected to the driving thin-film transistor DT. Since the description of the second exemplary aspect focuses on a structure and method for forming a very small-sized organic light-emitting diode OLED with the highest aperture ratio, a detailed description of the thin-film transistors and wiring lines will be omitted since they are common to the first and second exemplary aspects.

Trenches T are formed between the subpixels SPR, SPG, and SPB to separate the subpixels SPR, SPG, and SPB. Each subpixel has an anode ANO. The shapes of the anodes ANO are defined by the trenches T. For example, the trenches T are formed in a mesh pattern on the substrate SUB. As a result, the subpixels SPR, SPG, and SPB have the shape of rectangles defined by the trenches T and are arranged in a matrix.

The anode ANO of each subpixel SPR, SPG, and SPB comprises a reflecting electrode REF and a transparent electrode ITO. A first dielectric layer D1 and a second dielectric layer D2 are stacked between the reflecting electrode REF and the transparent electrode ITO. The reflecting electrode REF and the transparent electrode ITO are contacted with each other through contact portions CNT formed at the corners of the first and second dielectric layers D1 and D2. The structure of the anode ANO is slightly different with each subpixel SP.

In the anode ANO of the blue subpixel SPB, the first dielectric layer D1 and the second dielectric layer D2 are all stacked between the transparent electrode ITO and the reflecting electrode REF In the anode ANO of the green subpixel SPG, the first dielectric layer D1 is stacked with uniform thickness between the transparent electrode ITO and the reflecting electrode REF On the other hand, the second dielectric layer D2 may be stacked only on extremely small parts of the edges of the first dielectric layer D1. In the anode ANO of the red subpixel SPR, most parts of the transparent electrode ITO and reflecting electrode REF are directly contacted with each other. In the red subpixel SPR, most parts of the transparent electrode ITO and reflecting electrode REF are directly contacted with each other, and the first dielectric layer D1 and the second dielectric layer D2 are stacked only on extremely small parts of the edges of the reflecting electrode REF.

Hereinafter, a method of manufacturing a micro organic light-emitting diode display according to the second exemplary aspect of the disclosure will be described with reference to FIGS. 8A to 8G. FIGS. 8A to 8G are enlarged cross-sectional views illustrating a method of manufacturing a microdisplay according to the second exemplary aspect of the disclosure.

Figure 8A:
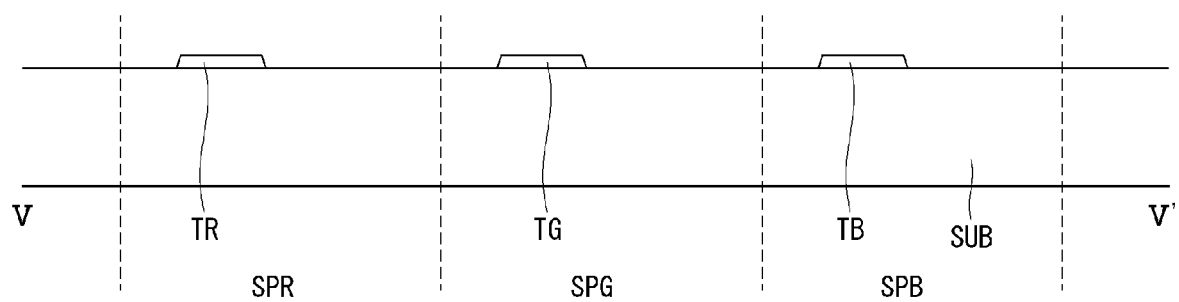
FIGS. 8A to 8G are enlarged cross-sectional views illustrating a method of manufacturing a microdisplay according to the second exemplary aspect of the disclosure.

Thin-film transistors are formed on a substrate SUB. In the case of an organic light-emitting diode display, switching thin-film transistors and driving thin-film transistors are formed. Only the driving thin-film transistors are illustrated herein for convenience of explanation. For example, a red driving thin-film transistor TR is placed in a red subpixel SPR, a green driving thin-film transistor TG is placed in a green subpixel SPG, and a blue driving thin-film transistor TB is placed in a blue subpixel SPB. A detailed manufacturing process of thin-film transistors is not an important issue in the disclosure, so a detailed description thereof will be omitted (FIG. 8A).

Figure 8B:
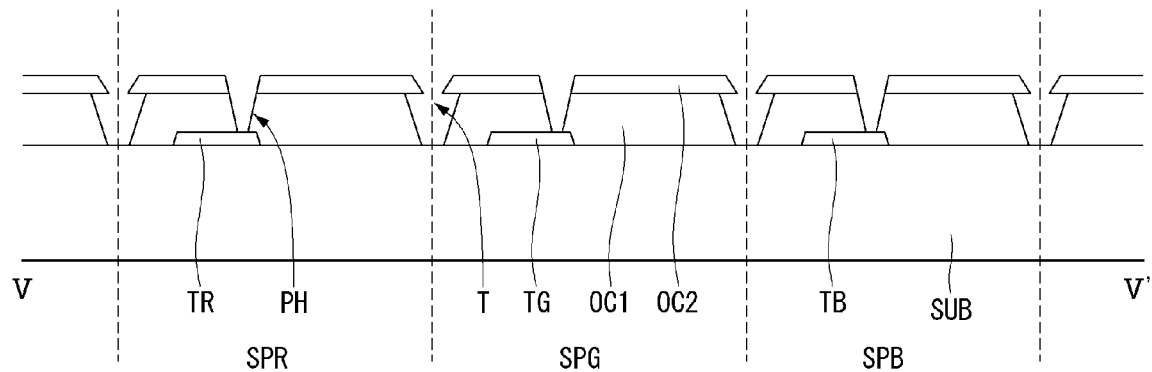
Figure 8C:
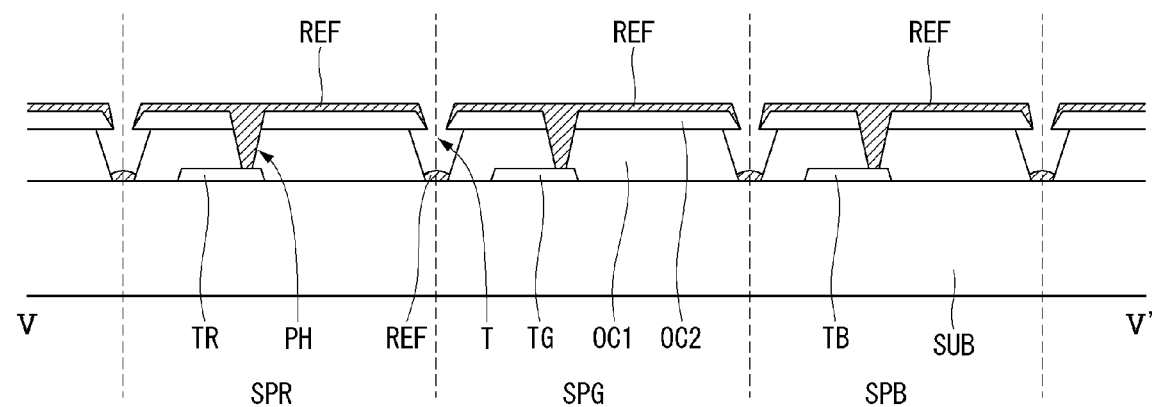
Figure 8D:
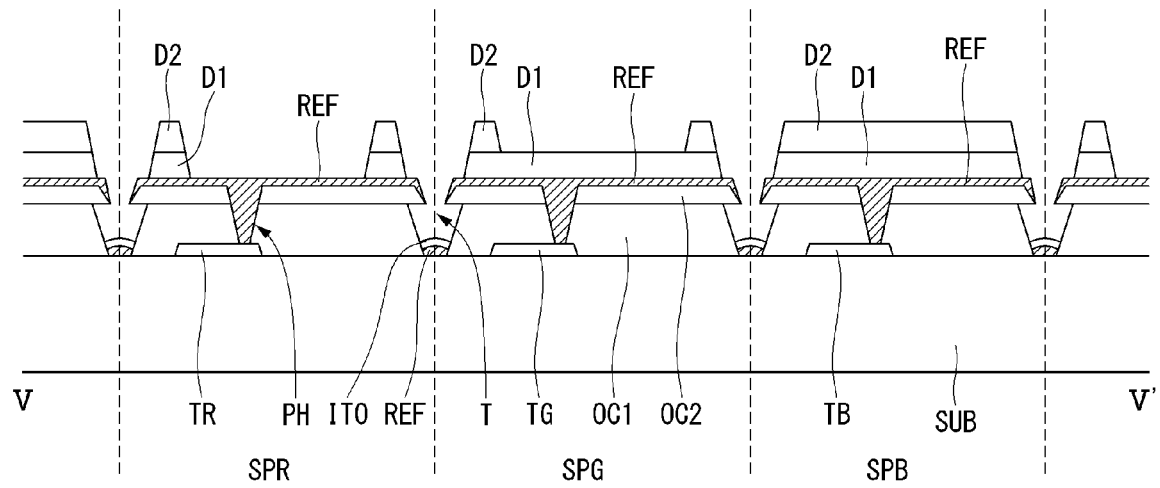
Figure 8E:
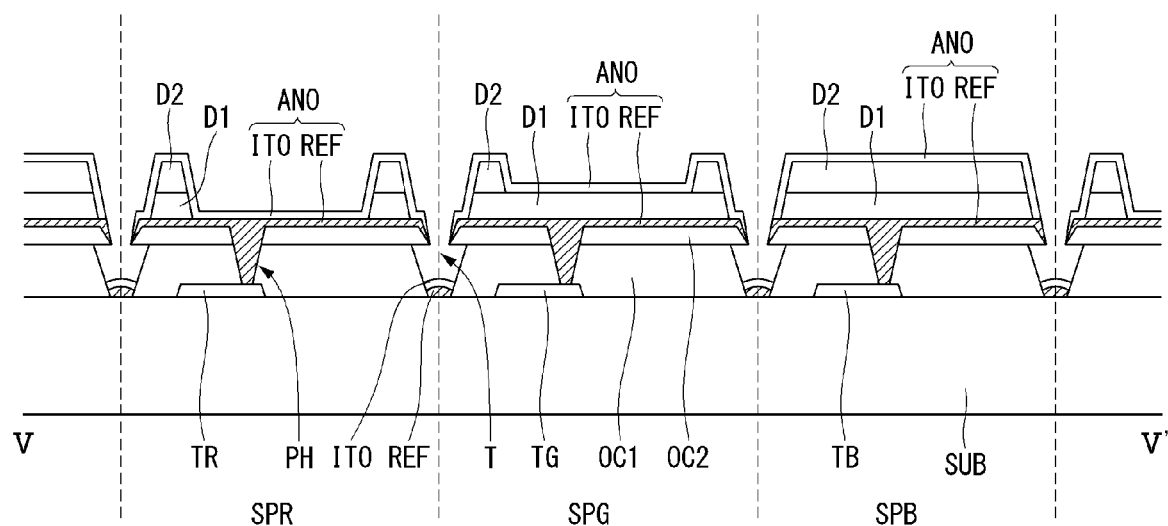

A first planarization film OC1 and a second planarization film OC2 are sequentially formed over the entire surface of a substrate SUB where the thin-film transistors TR, TG, and TB are formed. Pixel contact holes PH and trenches T are formed in the first and second planarization films OC1 and OC2. The pixel contact holes PH expose part of the thin-film transistors TR, TG, and TB. The trenches T are formed in a continuous mesh pattern between the subpixels SPR, SPG, and SPB. Although FIG. 8B illustrates that the surface of the substrate SUB is exposed by the trenches T, the surface of an insulating film or buffer layer covering parts of the thin-film transistors may be exposed. Particularly, a cross-section of the pixel contact holes PH have a forward tapered shape. On the contrary, the trenches T have an inverse tapered shape. The forward tapered shape is a shape in which an opening becomes gradually narrower from the top to the bottom. The inverse tapered shape is a shape in which the width of the top of an opening is smaller than the width of the bottom (shown in FIG. 8B).

A reflective metal material is deposited over the second planarization film OC2 where the pixel contact holes PH and the trenches T are formed. The reflective metal material may be a material with high light reflectance and low resistance, such as silver (Ag) and aluminum (Al). As a result, reflecting electrodes REF are formed individually in the subpixels SPR, SPG, and SPB. That is, once a reflective metal material is applied, the reflective metal material is self-defined by the trenches T and divided into the reflecting electrodes REF for the subpixels SPR, SPG, and SPB. The self-defining refers to forming a pattern along the shape of an existing structure, without a patterning process such as photolithography. Meanwhile, the reflecting electrodes REF formed in the subpixels SPR, SPG, and SPB may be connected individually to the thin-film transistors TR, TG, and TB via the pixel contact holes PH. Moreover, residues of the reflecting electrodes REF may be left in the trenches T (shown in FIG. 8C).

A first dielectric layer D1 and a second dielectric layer D2 are formed by applying and patterning an insulating material over the entire surface of the substrate SUB where the reflecting electrodes REF are formed. Particularly, in the red subpixel SPR, the first dielectric layer D1 and the second dielectric layer D2 are stacked only on extremely small parts of the edges of the reflecting electrodes REF. In the green subpixel SPG, the first dielectric layer D1 is stacked with a uniform thickness, but the second dielectric layer D2 is stacked only on extremely small parts of the edges of the first dielectric layer D1. In the anode ANO of the blue subpixel SPB, the first dielectric layer D1 and the second dielectric layer D2 are both stacked between the transparent electrode ITO and the reflecting electrode REF. Moreover, contact portions CNT exposing parts of the reflecting electrodes REF are formed at the four corners of the first dielectric layer D1 and second dielectric layer D2 (shown in FIG. 8D).

A transparent conductive material is deposited over the entire surface of the substrate SUB where the first dielectric layer D1 and the second dielectric layer D2 are formed. The transparent conductive material may comprise a material such as indium tin oxide or indium zinc oxide. The transparent conductive material is self-defined by the shape of the trenches T to have the same shape as the reflecting electrodes REF, thereby forming transparent electrodes ITO. Moreover, residues of the transparent electrodes ITO may be stacked on top of residues of the reflecting electrodes REF in the trenches T. Each anode ANO is composed of a reflecting electrode REF and a transparent electrode ITO, with the first dielectric layer D1 and the second dielectric layer D2 sequentially stacked in between. Particularly, the red subpixel SPR, green subpixel SPG, and blue subpixel SPB have a microcavity structure due to the differences in the stack structure of the first dielectric layer D1 and second dielectric layer D2 (shown in FIG. 8E).

Figure 8F:
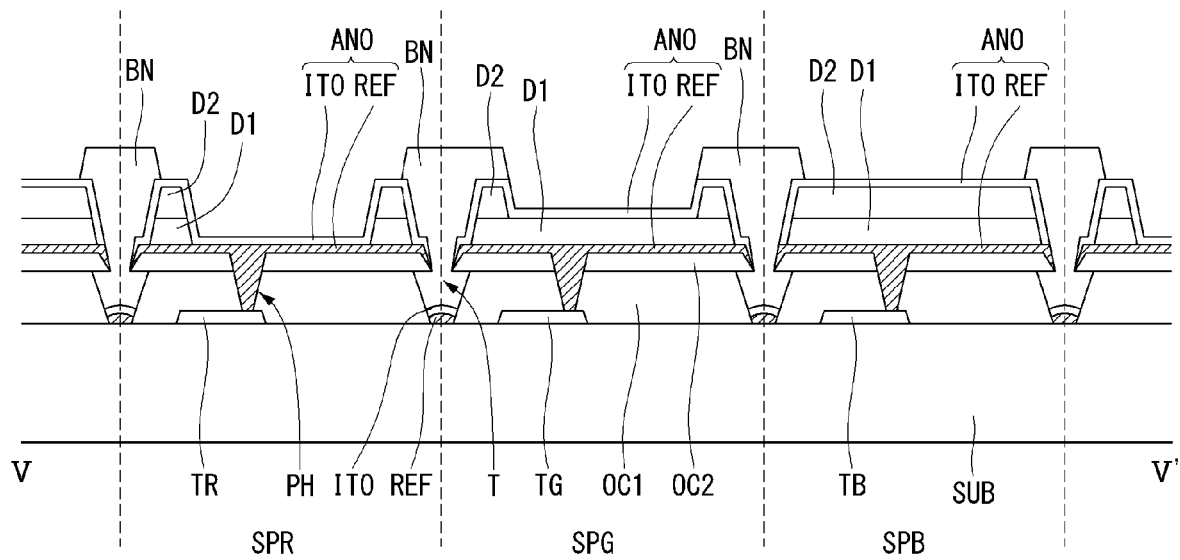
Figure 8G:
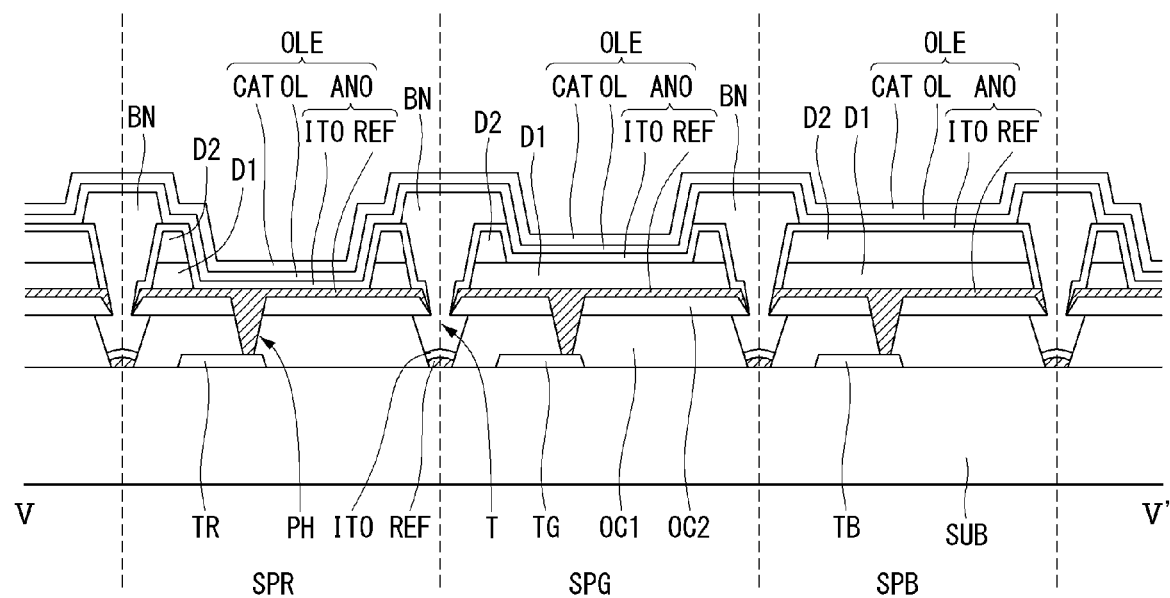

Banks BN are formed by applying and patterning an insulating material over the entire surface of the substrate SUB where the anodes ANO are formed. The banks BN may have the minimum size required to cover at least the contact portions CN. Light-emitting areas are defined by the banks BN. Thus, in the red subpixel SPR, the banks BN may be a size that covers the first dielectric layer D1 and second dielectric layer D2 stacked on the edges of the reflecting electrode REF In some cases, the banks BN may be omitted if the first dielectric layer D1 and the second dielectric layer D2 may function as the banks BN to some extent. However, the transparent electrodes ITO of the anodes ANO cover the first dielectric layer D1 and second dielectric layer D2, exactly in the shape of their tops. For this reason, if the banks BN do not cover the first dielectric layer D1 and the second dielectric layer D2, they may extend outward diagonally and be included in the light-emitting areas. In this case, color mixing may occur between neighboring subpixels. To prevent this, it is most desirable that the banks BN cover the edges of the first dielectric layer D1 and second dielectric layer D2 (FIG. 8F).

An organic emission layer OL and cathodes CAT are sequentially stacked over the surface of the substrate SUB where the banks BN are formed. The cathodes CAT comprise indium tin oxide or indium zinc oxide. As a result, an organic light-emitting diode OLE formed by sequentially stacking an anode ANO, the organic emission layer OL, and a cathode CAT is formed in each subpixel (shown in FIG. 8G).

In the second exemplary aspect of the disclosure, a process of forming micro-sized pixels in an organic light-emitting diode display with an ultra-high resolution has been described so far. In the case of a personal immersive display, an ultra-high resolution from 1,000 PPI to 5,000 PPI is required to enhance the sense of reality. If the personal immersive display has a resolution of 5,000 PPI, a unit pixel may be a size of 5.10 μm×5.10 μm, and a subpixel may be a size of 1.70 μm×5.10 μm. Particularly, if the reflecting electrode REF is made of silver (Ag) with high light reflectance, it is very difficult to precisely form a pattern with a linewidth of several μm by a photolithographic process. To precisely form micro subpixels, the second exemplary aspect of the disclosure uses a self-defining process.

In order to use the self-defining process, it is important to form trenches T with an inverse tapered structure when forming the anodes ANO. The trenches T have to be formed along with the pixel contact holes PH on the planarization films OC1 and OC2 covering the thin-film transistors T. The pixel contact holes PH are required to have a forward tapered shape so as to allow the thin-film transistors T and the anodes ANO to come into contact with each other. It is not easy to form the pixel contact holes PH and the trenches T on the same thin film because of their different shapes.

Figure 9A:
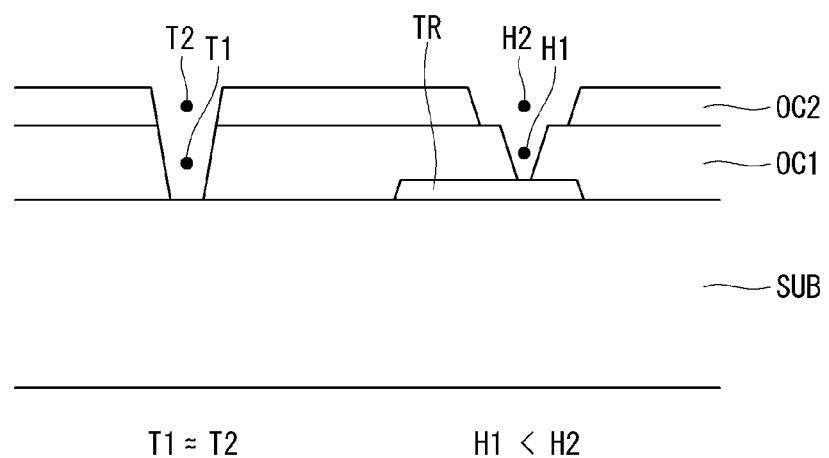
FIGS. 9A and 9B are enlarged cross-sectional views illustrating a method of producing trenches in the microdisplay according to the second exemplary aspect of the disclosure.
Figure 9B:
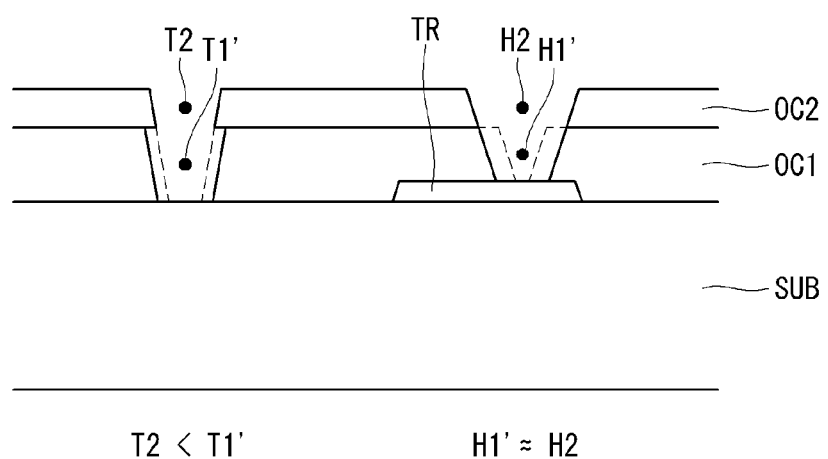

Referring to FIGS. 9A and 9B, an example of a method of forming trenches for a self-defining process according to the second exemplary aspect of the disclosure will be described below. FIGS. 9A and 9B are enlarged cross-sectional views of a method of producing trenches in the microdisplay according to the second exemplary aspect of the disclosure.

A red driving thin-film transistor TR is formed on a substrate SUB. A first planarization film OC1 is applied over the red driving thin-film transistor TR. A first trench T1 and a first pixel contact hole H1 are formed in the first planarization film OC1. The first trench T1 defines the boundary of the subpixel. The first pixel contact hole H1 exposes part of the red driving thin-film transistor TR.

A second planarization film OC2 is applied over the entire surface of the substrate SUB where the first planarization film OC1 is formed. A second trench T2 and a second pixel hole H2 are formed in the second planarization film OC2. In this case, the second trench T2 is formed in the same position as the first trench T1 and is the same size the first trench T1. On the other hand, the second pixel contact hole H2 is formed in the same position as the second pixel contact hole H1 and is a size larger than the first pixel contact hole H1 (shown in FIG. 9A).

Afterwards, the first planarization film OC1 is etched by using an etching solution that has high etching reactivity to the first planarization film OC1 but low etching reactivity to the second planarization film OC2. Then, the first planarization film OC1 positioned beneath the second planarization film OC2 is overetched selectively at the first trench T1 and the first pixel contact hole H1. As a result, the first trench T1 is formed into an inverse tapered trench T1' which is a size larger than the first trench T1. On the other hand, the first pixel contact hole H1 is formed into a forward tapered contact hole H1' which is the same size as the second pixel contact hole H2 (shown in FIG. 9B).

As above, trenches Ti having an inverse tapered shape and pixel contact holes PH having a forward tapered shape may be formed simultaneously using the difference in etching reactivity. To this end, it is desirable that the first planarization film OC1 and the second planarization film OC2 comprise different materials with different etching reaction properties. However, the disclosure is not limited to this method, and other methods such as a halftone masking technique and an undercut technique may be used.

While the aspect of the disclosure has been described in detail with reference to the drawings, it will be understood by those skilled in the art that the disclosure can be implemented in other specific forms without changing the technical spirit or essential features of the disclosure. Therefore, it should be noted that the forgoing aspects are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A microdisplay comprising:
    a plurality of unit pixels arranged in a matrix form on a substrate;
    a plurality of driving elements disposed in the unit pixels; and
    a plurality of organic light-emitting diodes disposed in the unit pixels and connected to the plurality of driving elements, respectively;
    wherein the plurality of organic light-emitting diodes each includes:
        an anode including a reflecting electrode, a first dielectric layer, a second dielectric layer and a transparent electrode that are sequentially stacked;
        a bank that covers the edges of the anode, over the second dielectric layer;
        an organic emission layer stacked over the anode; and
        a cathode stacked over the organic emission layer,
    wherein the first dielectric layer and the second dielectric layer have a contact portion that exposes at least one corner of the reflecting electrode, and the transparent electrode of the anode is connected to the reflecting electrode through the contact portion, and
    wherein each of the unit pixels includes a first subpixel, a second subpixel and a third subpixel, and in the first subpixel, the first and second dielectric layers are stacked over an entire surface of the reflecting electrode, and the contact portion is disposed under the bank.

2. The microdisplay of claim 1, wherein, in the second subpixel, the first dielectric layer is stacked over an entire surface of the reflecting electrode, the second dielectric layer is stacked only on the edges of the first dielectric layer, and the contact portion and the second dielectric layer are disposed under the bank.

3. The microdisplay of claim 1, wherein, in the second subpixel, only the first dielectric layer is stacked over an entire surface of the reflecting electrode, and the contact portion are disposed under the bank.

4. The microdisplay of claim 1, wherein, in the third subpixel, the first dielectric layer and the second dielectric layer are disposed only under the bank, corresponding to the edges of the reflecting electrode, and an inside area of the reflecting electrode surrounded by the bank directly contacts with a surface of the transparent electrode.

5. The microdisplay of claim 1, wherein, in the third subpixel, the first dielectric layer and the second dielectric layer are not formed, and the transparent electrode is stacked over the entire surface of the reflecting electrode.

6. The microdisplay of claim 1, wherein the reflecting electrode and the cathode of the first subpixel are spaced apart by a first distance equivalent to a sum of thicknesses of the organic emission layer, first dielectric layer, and second dielectric layer,
    the reflecting electrode and the cathode of the second subpixel are spaced apart by a second distance equivalent to a sum of thicknesses of the organic emission layer and first dielectric layer, and
    the reflecting electrode and cathode of a third subpixel are spaced apart by a third distance equivalent to a thickness of the organic emission layer.

7. The microdisplay of claim 1, wherein each of the unit pixels includes a plurality of subpixels and a plurality of trenches is formed in a continuous mesh pattern between adjacent subpixels of the plurality of subpixels to separate the adjacent subpixels.

8. The microdisplay of claim 6, further comprising:
    a first planarization film covering the plurality of driving elements and disposed over the substrate; and
    a second planarization film stacked over the first planarization film,
    wherein the plurality of trenches includes a first trench formed in the first planarization film, and a second trench in the second planarization film, wherein the second trench overlaps the first planarization film and has a size smaller than the first trench.

9. The microdisplay of claim 8, wherein the reflecting electrode is formed by depositing a reflective electrode material over an entire surface where the first and second trenches are formed to divide the reflective electrode material into each section for each subpixel according to shapes of the first and second trenches.

10. The microdisplay of claim 9, wherein the transparent electrode is formed by depositing a transparent electrode material over an entire surface where the first dielectric layer, the second dielectric layer, and the first and second trenches are formed to divide the transparent electrode material into each section for each subpixel according to the shapes of the first and second trenches.

11. The microdisplay of claim 8, further comprising a plurality of pixel contact holes formed in the first planarization film and the second planarization film and has a forward tapered shape to expose portions of the plurality of driving elements,
wherein the reflecting electrodes are contacted with the driving elements through the pixel contact holes.

12. A method of manufacturing an organic light-emitting diode display, the method comprising:
forming a plurality of driving elements on a substrate;
forming a first planarization film over an entire surface of the substrate where the plurality of driving elements is formed;
forming a second planarization film over the first planarization film;
forming a plurality of trenches with an inverse tapered shape to define a plurality of subpixels on the first planarization film and the second planarization film;
forming a plurality of reflecting electrodes by depositing a metal material over an entire surface where the plurality of trenches is formed so that the plurality of reflecting electrodes has shapes of the plurality of subpixels by the plurality of trenches;
forming a first dielectric layer and a second dielectric layer that are sequentially stacked on the surfaces of the plurality of reflecting electrodes to expose portions of corners of the plurality of reflecting electrodes; and
forming a plurality of transparent electrodes by depositing a transparent conductive material over an entire surface where the first dielectric layer and second dielectric layer are formed so that the plurality of transparent electrodes has shapes of the plurality of subpixels by the plurality of trenches.

13. A microdisplay comprising:
a plurality of pixels each pixel including first, second and third subpixels and a plurality of trenches is formed in a continuous mesh pattern between adjacent subpixels of the first, second and third subpixels to separate the adjacent subpixels; and
an organic light-emitting diode disposed in each subpixel and including an anode having a reflecting electrode, a first dielectric layer, a second dielectric layer and a transparent electrode that are sequentially stacked, an organic emission layer disposed over the anode, and a cathode disposed over the organic emission layer;
wherein the first dielectric layer and the second dielectric layer have a contact portion that exposes at least one corner of the reflecting electrode, and the transparent electrode of the anode is connected to the reflecting electrode through the contact portion,
wherein the plurality of trenches includes a first trench formed in a first planarization film, and a second trench in a second planarization film, wherein the second trench overlaps the first planarization film and has a size smaller than the first trench, and
wherein the reflecting electrode is formed by depositing a reflective electrode material over an entire surface where the first and second trenches are formed to divide the reflective electrode material into each section for each subpixel according to shapes of the first and second trenches.

14. The microdisplay of claim 13, further comprising a bank covering edges of the anode and disposed over the second dielectric layer.

15. The microdisplay of claim 13, wherein the reflecting electrode and the cathode of the first subpixel are spaced apart by a first distance equivalent to a sum of thicknesses of the organic emission layer, first dielectric layer, and second dielectric layer,
the reflecting electrode and the cathode of the second subpixel are spaced apart by a second distance equivalent to a sum of thicknesses of the organic emission layer and first dielectric layer, and
the reflecting electrode and cathode of the third subpixel are spaced apart by a third distance equivalent to a thickness of the organic emission layer.

16. The microdisplay of claim 13, wherein the transparent electrode is formed by depositing a transparent electrode material over an entire surface where the first dielectric layer, the second dielectric layer, and the first and second trenches are formed to divide the transparent electrode material into each section for each subpixel according to the shapes of the first and second trenches.

17. The microdisplay of claim 13, further comprising a plurality of pixel contact holes formed in the first planarization film and the second planarization film and has a forward tapered shape to expose portions of a plurality of driving elements,
wherein the reflecting electrodes are contacted with the driving elements through the pixel contact holes.

* * * * *